US006559544B1

United States Patent
Roth et al.

(10) Patent No.: US 6,559,544 B1
(45) Date of Patent: May 6, 2003

(54) PROGRAMMABLE INTERCONNECT FOR SEMICONDUCTOR DEVICES

(76) Inventors: Alan Roth, 5012 Woodview Ave., Austin, TX (US) 78756; Curtis Richardson, 7025 FM 1331, Taylor, TX (US) 76574

( * ) Notice: Subject to any disclaimer, the term of this patent is extended or adjusted under 35 U.S.C. 154(b) by 0 days.

(21) Appl. No.: 10/107,821

(22) Filed: Mar. 28, 2002

(51) Int. Cl.⁷ .......................... H01L 29/40; H01L 29/00
(52) U.S. Cl. ..................... 257/758; 257/750; 257/774; 257/776
(58) Field of Search ................... 257/758, 750, 257/774, 776, 508

(56) References Cited

U.S. PATENT DOCUMENTS

| | | | | |
|---|---|---|---|---|
| 6,248,658 B1 | * | 6/2001 | Buynoski | 438/622 |
| 6,291,305 B1 | * | 9/2001 | Huang et al. | 438/380 |
| 6,222,275 B1 | * | 4/2002 | Keeth | 257/776 |
| 6,392,253 B1 | * | 5/2002 | Saxena | 257/736 |
| 6,424,028 B1 | * | 7/2002 | Dickinson | 257/678 |
| 2002/0063249 A1 | * | 5/2002 | Sloman | 257/48 |
| 2002/0105406 A1 | * | 8/2002 | Llu et al. | 336/200 |
| 2002/0158321 A1 | * | 10/2002 | Duesman et al. | 257/678 |
| 2002/0172820 A1 | * | 11/2002 | Majumdar et al. | 428/357 |

* cited by examiner

Primary Examiner—Jasmine J B Clark
(74) Attorney, Agent, or Firm—Dowell & Dowell, P.C.

(57) ABSTRACT

A structure for selectively programming interconnections between an input contact and an output contact segment in a multilayer semiconductor, comprising a first group of metal segments each being formed on successive layers of the semiconductor and being interconnected by vias, the first group including the output contact segment; a second group of metal segments each formed on successive layers of the semiconductor and being interconnected by vias, the second group including the input contact segment; and means for connecting a metal segment in the first group to a metal segment in a corresponding layer in the second group, thereby connecting the input contact to the output contact.

10 Claims, 3 Drawing Sheets

PROGRAMMABLE INTERCONNECT FOR SEMICONDUCTOR DEVICES

BACKGROUND OF THE INVENTION

Taking a semiconductor device from a prototype stage to a volume production manufacturing stage often requires multiple revisions of the device with each revision correcting various deficiencies in the device's operation. Such revisions typically involve changes made to one or more metal layers in order to correct errors or modify the existing circuits. Such changes are often referred to as metal mask changes or metal spins. In order to implement such changes, a new metal mask layer is required to be created. Creating new metal masks can add considerable expense during the development of a new semiconductor product. Accordingly, there is a need to provide a mask, which maximizes the ability of a device to be made functional, and thereby minimizing the number of new masks required.

SUMMARY OF THE INVENTION

The present invention provides to a method and structure for selectively programming interconnections between a plurality of metal segments in a multilayer semiconductor devices. These metal programmable segments can be used for programming respective bits of a semiconductor device identification number by providing a plurality of possible changes for each bit of an identification number. The metal programmable layers can also be used for selectively adjusting characteristics of an electronic component such as a resistor or capacitor on the semiconductor device.

In accordance with this invention there is provided a structure for selectively programming interconnections between an input contact and an output contact segment in a multilayer semiconductor, comprising a first group of metal segments each being formed on successive layers of the semiconductor and being interconnected by vias, the first group including the output contact segment; a second group of metal segments each formed on successive layers of the semiconductor and being interconnected by vias, the second group including the input contact segment; and means for connecting a metal segment in the first group to a metal segment in a corresponding layer in the second group, thereby connecting the input contact to the output contact.

BRIEF DESCRIPTION OF THE DRAWINGS

An embodiment of the invention will now be described by way of example only with reference to the following drawings in which.

DETAILED DESCRIPTION OF THE PREFERRED EMBODIMENT

Figure 1:
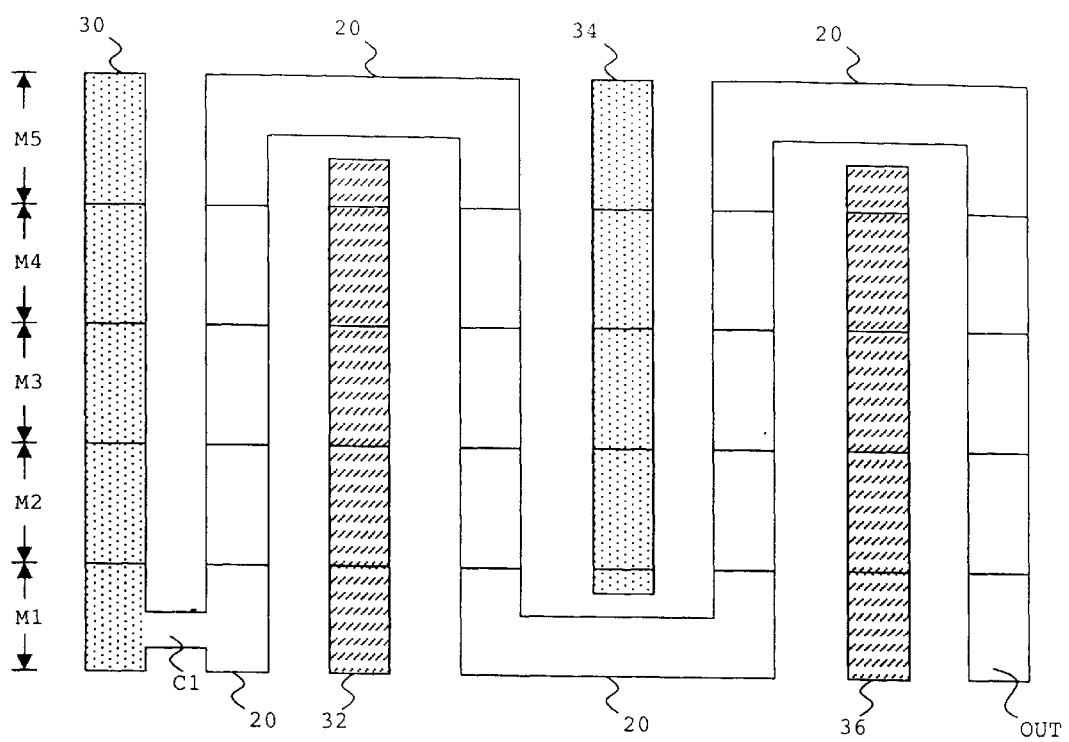
FIG. 1 is a plan view of a programmable interconnect according to an embodiment of the invention.
Figure 2:
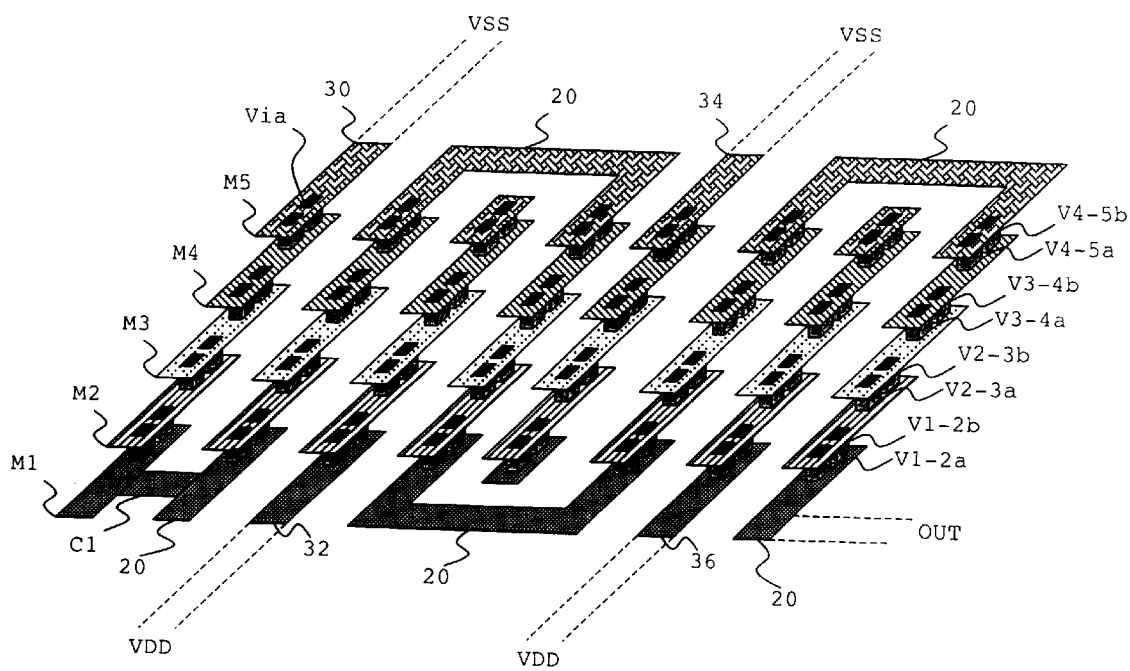
FIG. 2 is a perspective view of the programmable interconnect of FIG. 1.

In the following description like numerals refer to like structures in the drawings. Referring to FIG. 1 and FIG. 2 there are shown respective plan and perspective views of a programmable interconnect chain, shown in an initial state, according to an embodiment of the invention. The programmable interconnect chain appears as a serpentine-like structure 20 when viewed in plan as shown in FIG. 1. As illustrated in FIG. 2 the structure 20 is comprised of metal segments formed on successive metal layers, in this case from a first metal layer M1(shown as the lowermost layer) to a fifth metal layer M5 (shown as the uppermost layer) in a stair-like configuration. The structure 20 has multiple ascending and descending stair-like configurations.

The successive metal segments are interconnected by vias, starting from metal one M1 up to metal five M5 and then returning to metal one M1 passing through the intermediate layers of metals, namely metal two M2, three M3 and four M4 respectively. Thus, the first metal layer M1 is connected through a plurality of vias V1-2a and V1-2b to the second metal layer M2. The second metal layer M2 is connected through vias V2-3a and V2-3b to the third metal layer M3. The third metal layer M3 is connected through vias V3-4a and V3-4b to the fourth metal layer M4. Finally, the fourth metal layer M4 is connected through vias V4-5a and V4-5b to the fifth metal layer M5.

Five metal layers have been shown for the purpose of illustration, however, it is understood that any number of metal layers could be employed, according to the type of semiconductor process that is available for manufacturing the device.

Referring again to FIG. 2, there is shown structures for making selective contacts which are located in regions between the serpentine structure 20. The selective contact structures are provided adjacent to the metal programmable interconnect chain in a plurality of regions 30, 32, 34 and 36 and are also constructed in a similar stair-like ascending or descending connection configuration to the structure 20. However these may also be constructed in a stacked configuration.

In the embodiment shown, the contact points 36, 32 and 30, 34 are selectively connected to a voltage supply VDD, and a ground supply VSS, respectively. Alternately, as will be described in more detail later, the selective contact points can also be connected to an electronic component integrated on the semiconductor surface, such as a capacitor or a resistor.

As illustrated in FIG. 2, a left-most portion of the metal programmable interconnect chain 20 is connected through a metal connection C1 on metal layer M1 to the first selective contact structure 30.

All the metal segments interconnected by vias carry the same voltage signal to collectively represent a single conductive layer. Since the programmable interconnect chain 20 is connected through connector C1 to the selective contact 30, which in turn in connected to VSS, the ground voltage is carried by the chain up to the right-most portion of metal programmable interconnect 20 to its output OUT. This may then be used to provide a logic "0" level on layer M1.

If during the process of developing the chip a change in any one of the metal layers is required, then a new mask may be required to implement the change. For example, if there is a problem with a connection made in metal M3, then a new metal M3 mask would be required. Typically, a new metal mask is designated as a new revision of the chip, for example, Rev B or Rev C, etc, which is typically identified by a revision ID code stored in an on-chip register. By using the circuit and apparatus of the present invention, such a revision ID change can be implemented without requiring a new metal mask just for a change in the revision ID code. Thus in a multibit ID, a programmable interconnect chain is used for each bit to be programmed.

Figure 3:
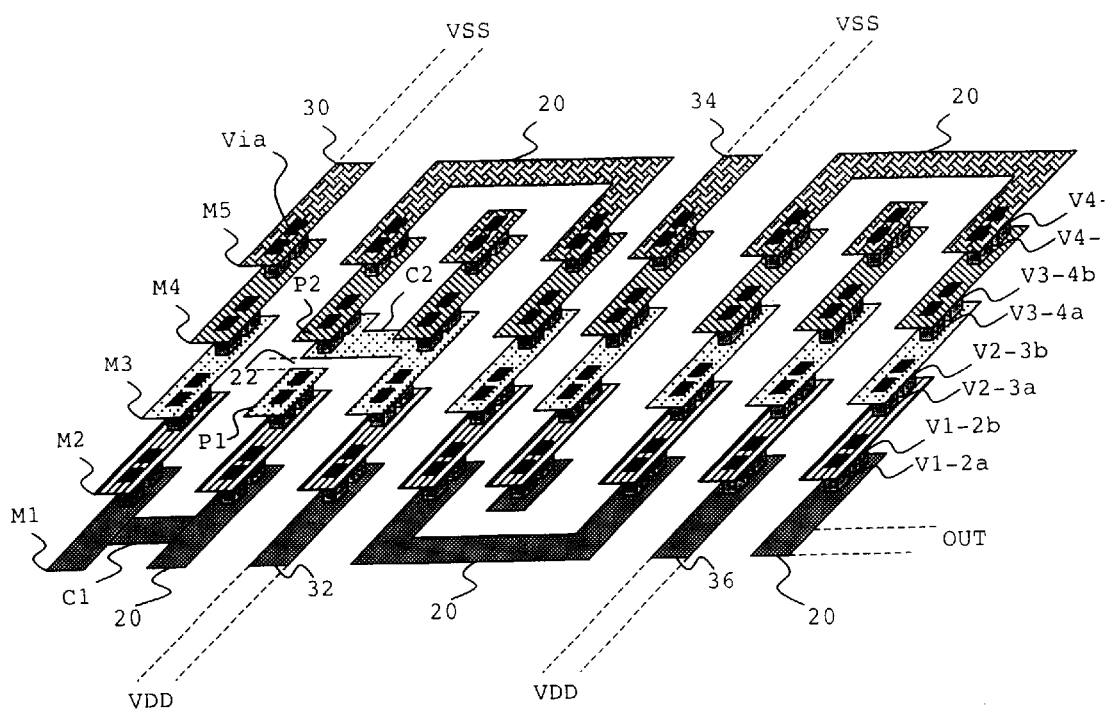
FIG. 3 is a perspective view of the programmable interconnect, programmed according to an embodiment of the invention.

Referring to FIG. 3, there is shown the programmable interconnect chain 20 which is programmed to provide a change from logic 0, at the OUT contact, 0 to a logic 1, assuming that a change in metal layer M3 is required. In order to propagate a logic 1, at the OUT contact the chain 20 has to be connected to the VDD source. Since the chain 20 is originally connected by metal connector C1 to the VSS source 30, the metal three M3 mask has to be modified in order to break the chain 20, and to connect the chain to a VSS source in one of its metal three layer M3 portions.

Choosing the left-most portion of the metal three layer M3 in the chain 20, a part 22 of the metal segment in layer M3 is removed to break the chain 20 in two parts P1 and P2 respectively. In the same metal layer M3 a connector C2 is provided for connecting the right-most part P2 of the chain 20 to the VDD source 32, so the output contact OUT provides a logic 1.

Since the connection C1 is still connected to VSS source 30, the part P1 of the chain 20 remains at VSS.

Even though any metal portion in the metal programmable interconnect chain 20 can be used for performing such a change, it will be evident to the reader that the left-most metal portion is preferred, since the chain 20 can be amended through multiple changes from the left-most side of the chain to the right-most side where the output OUT is taken. Of course if the OUT is located on the left then the opmposite to the above will apply.

A person skilled in the art will note that to implement the present invention, all changes should comply with the layout design rules specified for that particular integrated circuit, i.e. metal-to-metal spacing, minimum via area, minimum wire width and the minimum overlap of the metal over the vias, among others. For this reason, the break and connection of the metal programmable chain 20 should not be done on the same metal layer portion. In the above mentioned example, the left-most portion of the chain 20 is used to break the chain, and the following metal portion available to the right is used for connecting the chain 20 to the desired selective contact.

In a further embodiment of the present invention, the metal programmable interconnect chain 20 can be used not just for programming a bit, but also for selecting or deselecting other elements such as resistors or capacitors. If in FIGS. 1 and 2, the sources 30 to 36 are connected to capacitors instead of being connected to VDD and VSS sources, and each capacitor having a particular capacitance, then the chain 20 can be used to increase or decrease the number of capacitors connected to it, so the overall capacitance provided at the output OUT can be easily modified by changing a metal section on a single layer. A similar implementation can also be constructed for a resistance chain.

While the invention has been described in connection with a specific embodiment thereof and in a specific use, various modifications thereof will occur to those skilled in the art without departing from the spirit of the invention.

The terms and expressions which have been employed in the specification are used as terms of description and not of limitations, there is no intention in the use of such terms and expressions to exclude any equivalents of the features shown and described or portions thereof, but it is recognized that various modifications are possible within the scope of the invention.

We claim:

1. A structure for selectively programming interconnections between an input contact and an output contact segment in a multilayer semiconductor, comprising:

(a) a first group of metal segments each being formed on successive layers of said semiconductor and being interconnected by vias, said first group including the output contact segment;

(b) a second group of metal segments each formed on successive layers of said semiconductor and being interconnected by vias, said second group including the input contact segment; and (c) means for connecting a metal segment in said first group to a metal segment in a corresponding layer in said second group, thereby connecting said input contact to said output contact.

2. A structure as define in claim 1, said input contact being coupled to a signal source.

3. A structure as define in claim 2, said signal source being VSS.

4. A structure as define in claim 2, said signal source being VDD.

5. A structure as define in claim 1, said first group forming a serpentine-like structure in plan.

6. A structure as define in claim 5, including a plurality of said second groups, each being located in regions between said serpentine-structure.

7. A structure as define in claim 1, said input contact being coupled to a capacitive element.

8. A structure as define in claim 1, said input contact being coupled to a resistive element.

9. A structure as define in claim 7, said output contact being coupled to a capacitive element.

10. A structure as define in claim 8, said output contact being coupled to a restitive element.

* * * * *